(12) United States Patent
Cha

(10) Patent No.: US 6,222,726 B1
(45) Date of Patent: Apr. 24, 2001

(54) PORTABLE PERSONAL COMPUTER WITH ARRANGEMENT FOR CONNECTING AN EXPANSION CARD TO A SOCKET THEREIN

(75) Inventor: Jung-Woo Cha, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/287,339

(22) Filed: Apr. 7, 1999

(30) Foreign Application Priority Data

Apr. 10, 1998 (KR) .................................................. 98/12827

(51) Int. Cl.[7] .................................. G06F 1/16; H05K 5/20
(52) U.S. Cl. ............................. 361/683; 361/686; 439/377
(58) Field of Search .................................... 361/683, 684, 361/685, 679, 686, 724–727; 248/917; 312/350; 439/928.1, 945, 374, 377; 108/108; D18/6, 7, 8

(56) References Cited

U.S. PATENT DOCUMENTS

| D. 415,476 | * | 10/1999 | Nara et al. .............................. D18/7 |
| D. 420,987 | * | 2/2000 | Miyahara et al. ....................... D18/7 |
| 4,143,417 | * | 3/1979 | Wald et al. ........................... 364/900 |
| 5,468,947 | * | 11/1995 | Danielson et al. .................... 235/472 |
| 5,470,241 | * | 11/1995 | Kaufman et al. ..................... 439/159 |
| 5,537,292 | * | 7/1996 | Bowen ................................. 361/737 |
| 5,574,625 | * | 11/1996 | Ohgami et al. ....................... 361/684 |
| 5,661,634 | * | 8/1997 | Obata et al. .......................... 361/684 |
| 5,805,416 | * | 9/1998 | Friend et al. ........................ 361/686 |
| 5,805,474 | * | 9/1998 | Danielson et al. ................. 364/708.1 |
| 5,889,649 | * | 3/1999 | Nabetani et al. ..................... 361/684 |
| 6,016,248 | * | 1/2000 | Anzai et al. .......................... 361/683 |

* cited by examiner

Primary Examiner—Leo P. Picard
Assistant Examiner—Lisa Lea-Edmonds
(74) Attorney, Agent, or Firm—Robert E. Bushnell, Esq.

(57) ABSTRACT

The housing of a palm-sized computer consists of a top housing part having an upper surface, side surfaces and an opened bottom and a bottom housing part for covering the opened bottom to enclose an electronic circuit board. The housing is provided with an expansion card arrangement for electrically connecting an expansion card with the electronic circuit board, which comprises an card insertion opening formed on one side of the housing for inserting the expansion card into the housing, a socket formed on the electronic circuit board to electrically connect the expansion card with the electronic circuit board, the opening of the socket directly facing the card insertion opening, and a guide support integrally formed with the housing between the card insertion opening and the socket so as to guide and support the expansion card inserted through the card insertion opening into the socket.

14 Claims, 6 Drawing Sheets

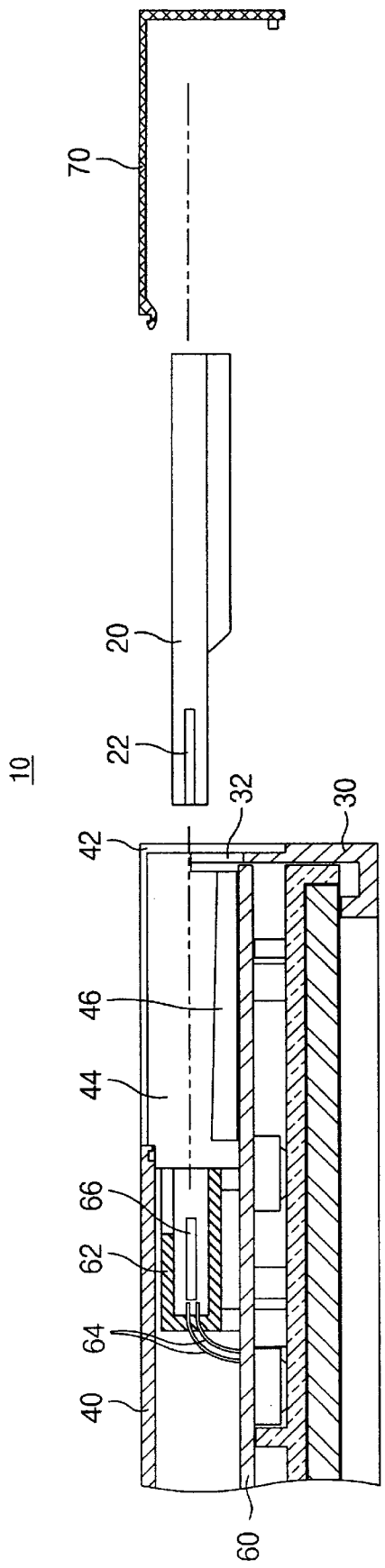

PORTABLE PERSONAL COMPUTER WITH ARRANGEMENT FOR CONNECTING AN EXPANSION CARD TO A SOCKET THEREIN

CLAIM OF PRIORITY

This application makes reference to, incorporates the same herein, and claims all benefits accruing under 35 U.S.C. §119 from an application for PORTABLE PERSONAL COMPUTER WITH ARRANGEMENT FOR CONNECTING AN EXPANSION CARD TO A SOCKET THEREIN earlier filed in the Korean Industrial Property Office on the 10th of April 1998 and there duly assigned Ser. No. 12827/1998.

BACKGROUND OF THE INVENTION

1. Field of the Invention

The present invention concerns a portable personal computer, particularly a pocket or palm-sized computer, and more particularly an arrangement for connecting an expansion or add-on card to a socket therein.

2. Related Art

Personal computers (PCs) are classified on the basis of size and portability. Personal computers that can be placed on top of a desk but are not very portable are called desktop computers. Portable computers are those personal computers that are light enough to be easily transported. Portable personal computers that are small enough to be set on the lap of a user are called laptop computers; notebook computers are approximately the size of a book. Portable personal computers that can be put in a pocket are called pocket or palm-sized computers. The palm-sized computer includes a wallet PC, PDA (Personal Digital Assistance) and HPC (Hand-held Personal Computer).

The expansion or add-on card is a card on which electronic devices are mounted, and is inserted in a socket formed in such a portable personal computer in order to improve its performance or functionality. Recently, the expansion card widely has been standardized including PCMCIA (Personal Computer Memory Card International Association) card and CF card (Compact Flash) such as memory card, fax/modem card, LAN card, etc. However, the expansion card used in the notebook computer is usually incompatible with the palm-sized computer because of the considerable size difference between these computers.

Examples of the contemporary art dealing with arrangements of expansion cards in computers is seen, for example, in the following U.S. Patents. U.S. Pat. No. 5,519,571, to Shieh, entitled Portable Hard Disk Drive Connector With A Parallel (Printer) Port Control Board And A U-Shaped Frame, describes a device having a casing, within which is a control card with a hard disk connector provided at both ends with a rack thereby forming a U-shaped frame, into which a hard disk drive with a PCMCIA is connected. The device itself is not a portable computer, and the arrangement of this device has the hard disk drive extending out from the housing to allow manipulation. Such an arrangement is not suitable for a palm-sized computer.

U.S. Pat. No. 5,608,606, to Blaney, entitled Computer Plug-In Module And Interconnection System For Wireless Applications, describes a system for coupling wireless technologies to a computer. A card connector provides a radiofrequency connector positioned above a 68-pin connector. As in other PCMCIA devices, the plug-in module is of a size and arrangement which is not ideal for a palm-sized computer.

U.S. Pat. No. 5,608,607, to Dittmer, entitled PCMCIA Card And Associated Support And Circuitry Augmenting Apparatus And Methods, describes a PCMCIA card apparatus in which a PCMCIA card and an attachment section are inserted into a dual PCMCIA card slot. This apparatus, however, does not provide an expansion card arrangement suitable for a palm-sized computer.

U.S. Pat. No. 5,642,259, to Ma, entitled Arrangement for connecting An Expansion Card To A Connector Socket In A Personal Computer, describes an expansion card arrangement with a frame disposed on a substrate board of a notebook computer, contact pins within the frame and connected to the motherboard, and also having a connecting socket on the substrate board. This arrangement of a conventional PCMCIA card requires separate access for the connecting socket, and offers no advantage in size reduction.

U.S. Pat. No. 5,708,840, to Kikinis et al., entitled Micro Personal Digital Assistant, describes a digital assistant device having an inserted function module which is a Type 2 PCMCIA having dimensions corresponding to PCMCIA standards. This apparatus is of notebook computer size and holds several standard PCMCIA cards.

U.S. Pat. No. 5,801,922, to Shen et al., entitled Portable Computer Having Insertable Module Containing Expansion Units And Connected To A Socket Secured On The Main-circuit Board, describes a multi-unit module of a personal computer, having a personal computer housing and a module casing. Expansion units such as disk drives can be inserted and stacked in the module casing. This apparatus is also of notebook computer size, and does not address the problem of size reduction for a palm-sized computer.

SUMMARY OF THE INVENTION

Therefore it is an object of the present invention to provide an improved palm-sized computer.

It is a further object of the invention to reduce the size of a palm-sized computer having an expansion card.

It is a yet further object of the present invention to provide a palm-sized computer having an arrangement for connecting a new type of expansion card which is totally enclosed by the housing of the computer.

It is a still further object of the present invention to provide a palm-sized computer with an arrangement for connecting an expansion card in which the expansion card is resiliently supported in the socket.

It is a yet still further object of the present invention to provide a palm-sized computer in which an expansion card is guided into the socket.

According to an embodiment of the present invention, the housing of a palm-sized computer consists of a top housing part having an upper surface, side surfaces and an opened bottom and a bottom housing part for covering the opened bottom to enclose an electronic circuit board. The housing is provided with an expansion card arrangement for electrically connecting an expansion card with the electronic circuit board, which comprises an card insertion opening formed on one side of the housing for inserting the expansion card into the housing, a socket formed on the electronic circuit board to electrically connect the expansion card with the electronic circuit board, the opening of the socket directly facing the card insertion opening, and a guide support integrally formed with the housing between the card insertion opening and the socket so as to guide and support the expansion card inserted through the card insertion opening into the socket.

Preferably, a cover may be detachably attached to the card insertion opening to protect the expansion card. The card insertion opening is formed by a first cut formed in the bottom housing part and a second cut formed in one side surface of the top housing part, and the cover consists of two parts respectively connected to the top and bottom housing parts. The guide support is inclined from the card insertion opening towards the socket, resiliently supporting and guiding the expansion card into the socket. The guide support further comprises a pair of first support faces respectively extended from both ends of the card insertion opening towards the socket to support both sides of the expansion card, and a pair of second support faces respectively extended from the first support faces to respectively support the parts of the lower surface of the expansion card adjacent to both sides thereof. The second support faces are inclined from the card insertion opening towards the opening of the socket, resiliently supporting the expansion card.

The present invention will now described more specifically with reference to the drawings attached only by way of examples.

BRIEF DESCRIPTION OF THE ATTACHED DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 4A is a cross sectional view taken along line IV—IV of FIG. 3 before mounting an expansion card and the cover in a palm-sized PC;

DETAILED DESCRIPTION OF THE PREFERRED EMBODIMENTS

Figure 1:
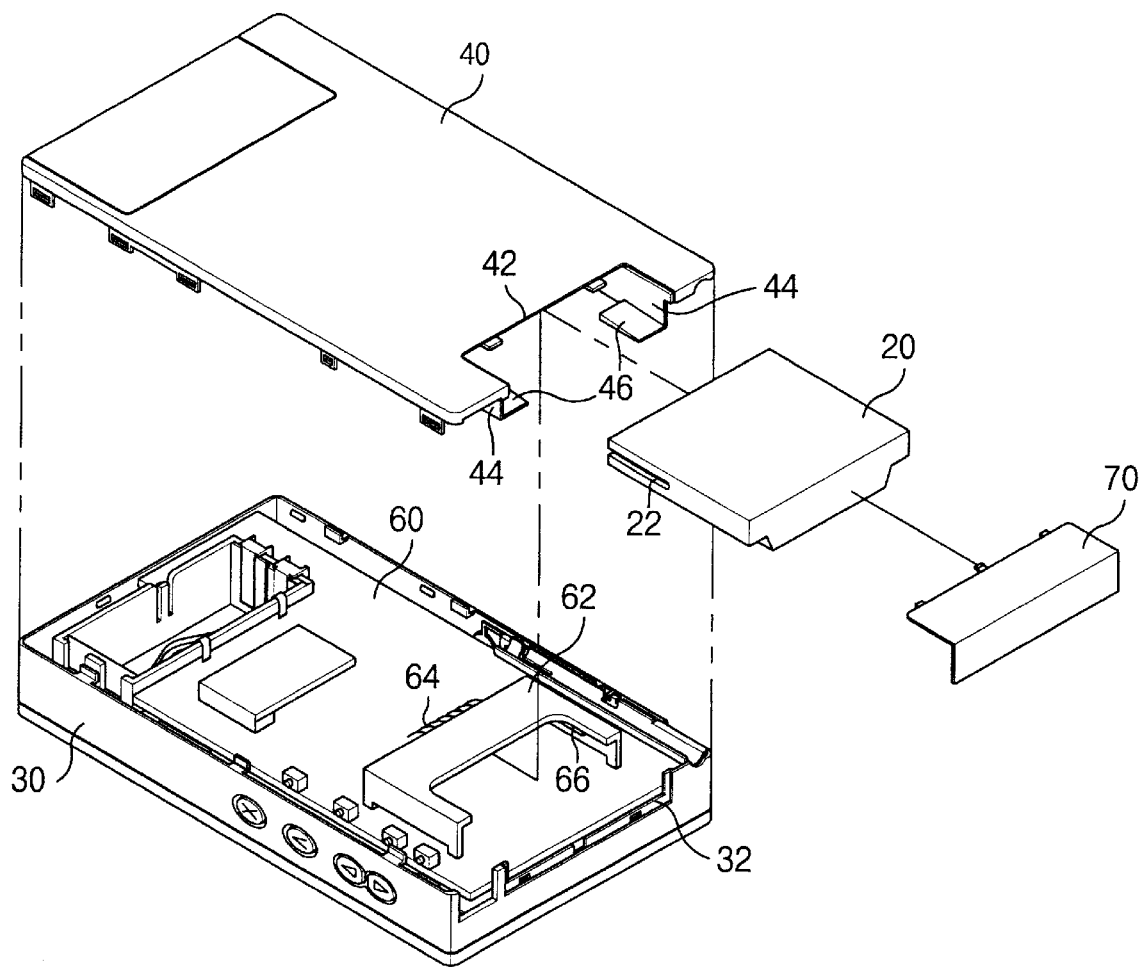
FIG. 1 is an exploded perspective view for illustrating the structure of a palm-sized PC according to the present invention.
Figure 2:
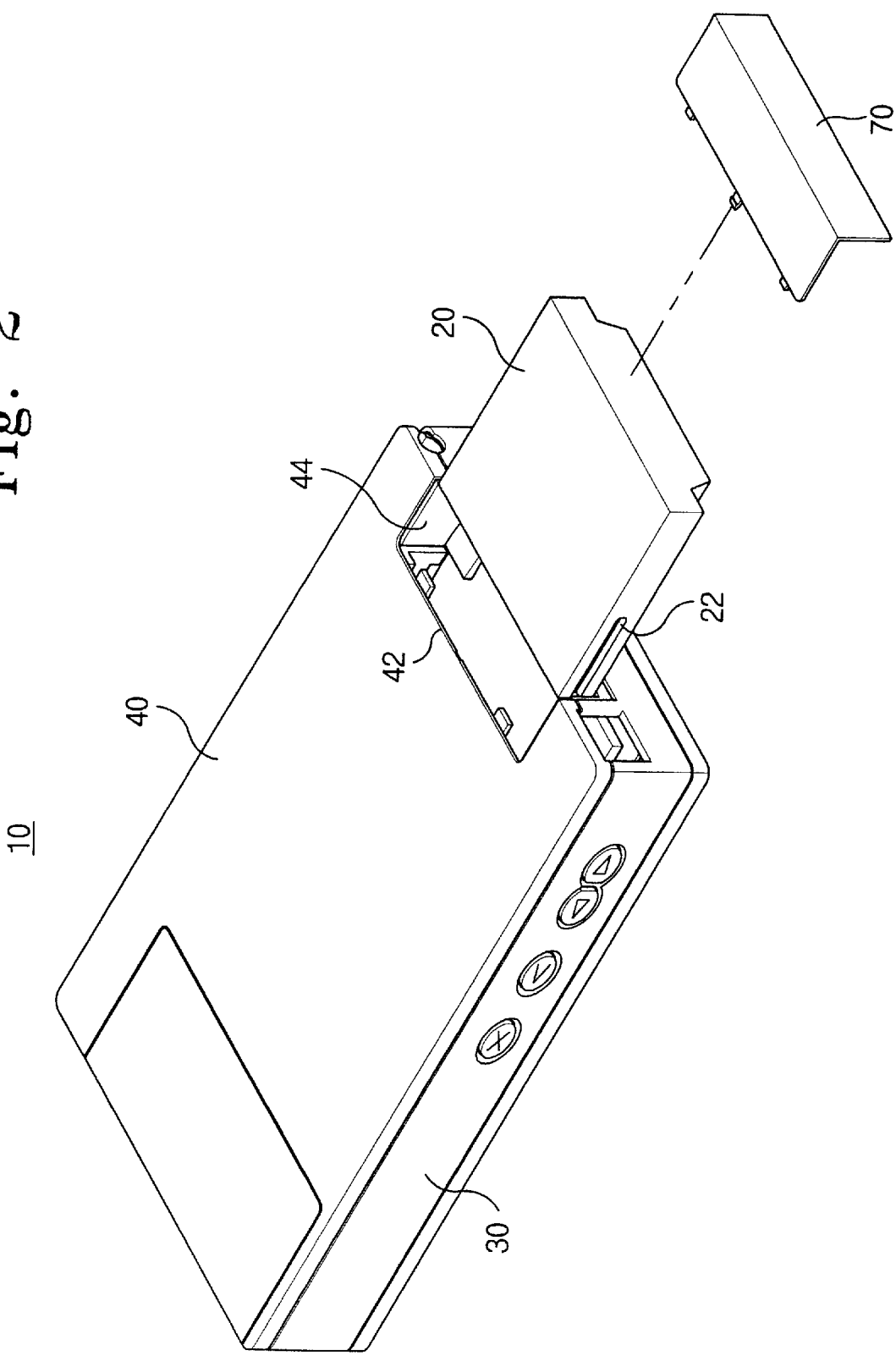
FIG. 2 is a perspective view for illustrating an expansion card being inserted into a palm-sized PC as shown in FIG. 1.
Figure 3:
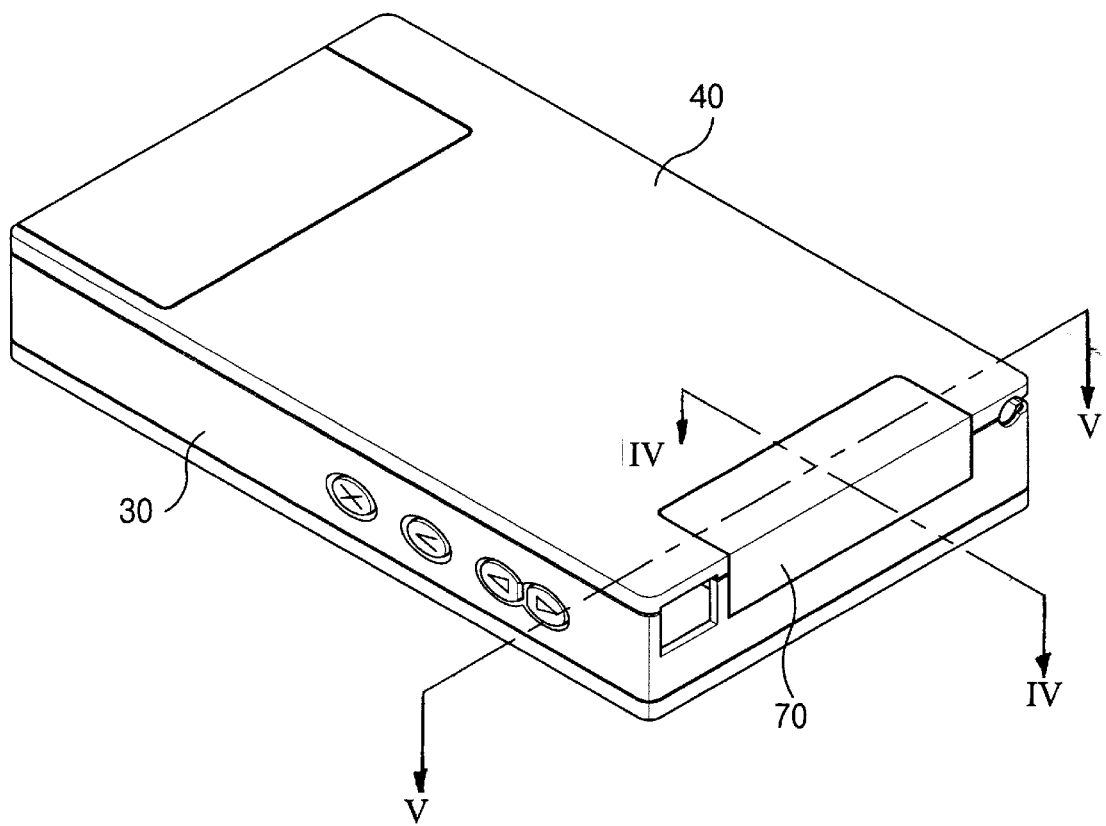
FIG. 3 is a perspective view for illustrating a cover attached to the card insertion opening of a palm-sized PC as shown in FIG. 2.

The present invention will now be described with reference to the drawings. The same reference numerals are used to represent corresponding parts throughout the attached drawings. Referring to FIGS. 1 to 3, the housing of a palm-sized computer 10 consists of a top housing part 30 and a bottom housing part 40 to enclose an electronic circuit board 60 which may be the main board of the computer or another connected thereto. The circuit board 60 is provided with a socket 62 to electrically connect an expansion card 20 with its electronic circuit. The socket 62 includes a plurality of pins 64 connected with corresponding electrical contacts (not shown) of the expansion card 20. The pins 64 are connected with the electronic circuit of the circuit board 60. In addition, the socket 62 is internally provided with clamping protrusions 66 respectively held by recesses 22 formed in both sides of the expansion card 20 so as to correctly connect the pins 64 and the corresponding electrical contacts of the expansion card 20 inserted into the socket 62.

A card insertion opening for inserting the expansion card 20 into the housing consists of a first cut 32 formed in the top housing part 30 and a second cut 42 formed in the bottom housing part 40. The first and second cuts 32 and 42 are combined to make the card insertion opening when the top and bottom housing parts are assembled together. The structure for detachably attaching the expansion card 20 to the socket 62 may be achieved in various forms. In addition, a cover 70 to close the card insertion opening may be provided. The cover 70 preferably consists of two parts respectively connected with the top and bottom housings 30 and 40 to cover the first and second cuts 32 and 42.

Integrally formed with the housing is a guide support between the card insertion opening and the socket 62 so as to guide and support the expansion card 20 inserted through the card insertion opening into the socket. The guide support is inclined from the card insertion opening towards the socket 62 resiliently supporting and guiding the expansion card 20 into the socket 62.

The guide support comprises a pair of first support faces 44 respectively extended from both ends of the card insertion opening towards the socket 62 to support both sides of the expansion card 20, and a pair of second support faces 46 respectively extended from the first support faces 44 to respectively support the parts of the lower surface of the expansion card 20 adjacent to both sides thereof. The first support faces 44 are to align both sides of the expansion card 20 inserted into the socket 62 while the second support faces 46 to align the bottom of the expansion card 20. The second support faces 46 are inclined from the card insertion opening towards the opening of the socket 62, resiliently supporting the expansion card 20. The resilient support of the second support faces 46 serves to prevent the expansion card 20 from being unintentionally detached from the socket 62.

Figure 4B:
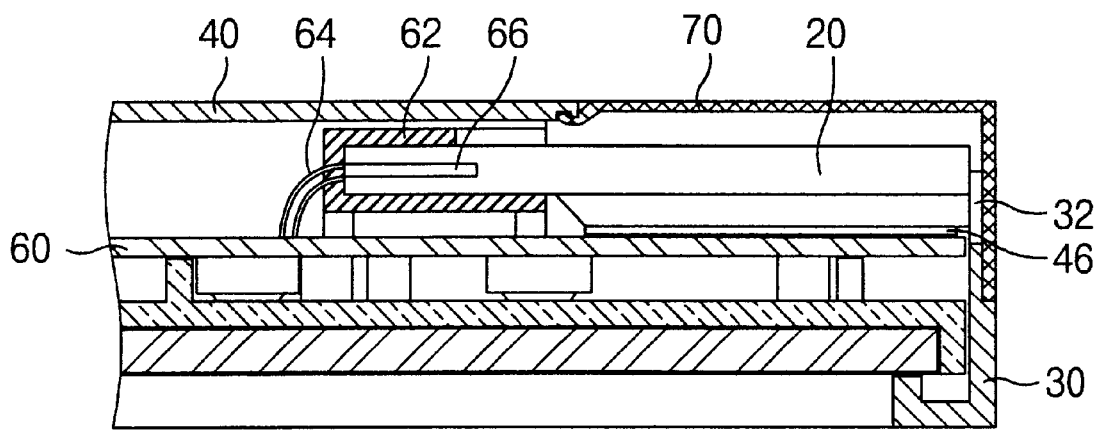
FIG. 4B is a cross sectional view taken along line IV—IV of FIG. 3 after mounting an expansion card and the cover in a palm-sized PC.
Figure 5:
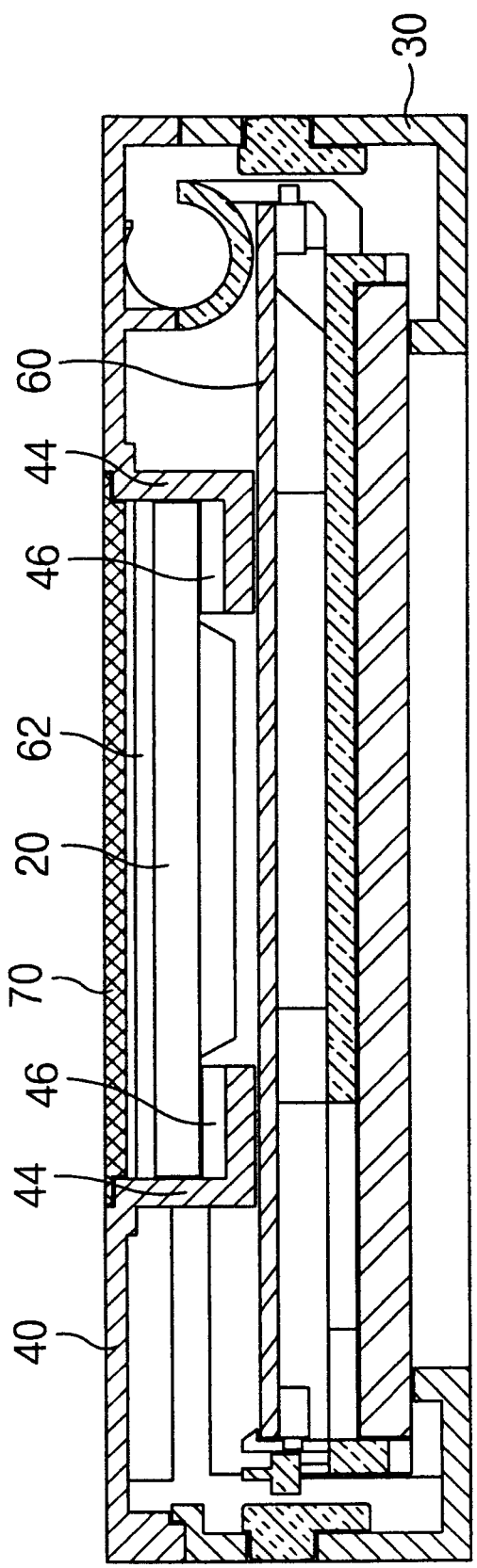
FIG. 5 is a cross sectional view taken along line V—V of FIG. 3.

Referring to FIGS. 4A to 5, the expansion card 20 is guided and supported by the guide support to be detachably attached to the socket 62 of the computer. Thus, the guide support makes the effective use of the internal space of the palm-sized computer 10 because it does not require a separate mounting space in addition to the space occupied by the expansion card 20, which is inserted through the card insertion opening into the socket 62. As described above, the card insertion opening consists of the first and second cuts 32 and 42 respectively formed in the top and bottom housing parts 30 and 40, protected by the cover 70. Inserting the expansion card 20 into the card insertion opening, it is supported and guided by the first and second support faces 44 and 46 of the guide support towards the socket 62. Because the second support faces 46 are inclined upwards, the expansion card 20 is inserted into the socket 62 resiliently supported upwards. The resilient support causes the expansion card 20 to closely contact the socket 62 until the electrical contacts of the expansion card completely engage the electrical connection pins formed in the bottom of the socket 62.

While the present invention has been described in connection with specific embodiments accompanied by the attached drawings, it will be readily appreciated by those skilled in the art that various changes and modifications may be made thereto without departing the gist of the present invention.

What is claimed is:

1. A palm-sized computer, comprising:

a housing enclosing the components of the computer, said housing comprising:
   a top housing part having an upper surface and sides;
   a bottom housing part joining with said top housing part;
a card insertion opening formed on one side of said housing for inserting an expansion card into said housing;
an electronic circuit board enclosed in said housing
a socket formed on said electronic circuit board for electrically connecting said expansion card with said circuit board, the opening of the socket facing said card insertion opening; and
a guide support integrally formed with said housing between said card insertion opening and said socket for guiding said expansion card through said card insertion opening into said socket;
said guide support being inclined from said card insertion opening toward said socket so as to provide a narrowing space toward said socket, for resiliently supporting and guiding an expansion card.

2. The palm-sized computer of claim 1, further comprising:
   an expansion card inserted in said socket and enclosed by said housing.

3. The palm-sized computer of claim 1, further comprising:
   said card insertion opening being defined by a first cut formed in said bottom housing part and a second cut formed in one side surface of said top housing part aligned with said first cut.

4. The palm-sized computer of claim 1, further comprising: a cover detachably attached to the housing, for closing the card insertion opening.

5. The palm-sized computer of claim 3, further comprising:
   a cover detachably attached to the housing, for closing the card insertion opening, said cover comprising:
      a first portion complementary to said first cut in said bottom housing; and
      a second portion attached to the first portion and complementary to the second cut in the top housing.

6. The palm-sized computer of claim 2, further comprising:
   a cover detachably attached to the housing, closing the card insertion opening and covering the expansion card.

7. The palm-sized computer of claim 1, said guide support further comprising:
   a pair of first support faces on the inside of the housing and perpendicular to the main surface of the housing, said first support faces parallel to each other and extending inward from both ends of the card insertion opening, said first support faces for supporting both sides of an expansion card; and
   a pair of second support faces extending from said first support faces for supporting the lower surface of an expansion card.

8. The palm-sized computer of claim 7, further comprising a cover detachably attached to the housing, for closing the card insertion opening.

9. The palm-sized computer of claim 3, said guide support further comprising:
   a pair of first support faces on the inside of and perpendicular to the main surface of the bottom housing part, parallel to each other, and extending inward from both ends of the card insertion opening, said first support faces for supporting both sides of an expansion card; and
   a pair of second support faces extending from said first support faces for supporting the lower surface of an expansion card.

10. The palm-sized computer of claim 9, further comprising a cover detachably attached to the housing, for closing the card insertion opening.

11. The palm-sized computer of claim 1, further comprising a cover detachably attached to the housing, for closing the card insertion opening.

12. The palm sized computer of claim 9, said second support faces being inclined from said card insertion opening toward said socket so as to provide a narrowing space toward the socket, for resiliently supporting and guiding an expansion card.

13. The palm-sized computer of claim 12, further comprising a cover detachably attached to the housing, for closing the card insertion opening.

14. The palm-sized computer of claim 1, further comprising:
   clamping protrusions on two sides of the socket for holding recesses formed in both sides of an expansion card.

* * * * *